United States Patent
Bryan et al.

(10) Patent No.: US 6,554,046 B1
(45) Date of Patent: Apr. 29, 2003

(54) SUBSTRATE CLEAVING TOOL AND METHOD

(75) Inventors: Michael A. Bryan, Los Gatos, CA (US); James K. Kai, San Francisco, CA (US)

(73) Assignee: Silicon Genesis Corporation, Campbell, CA (US)

( * ) Notice: Subject to any disclaimer, the term of this patent is extended or adjusted under 35 U.S.C. 154(b) by 280 days.

(21) Appl. No.: 09/723,467

(22) Filed: Nov. 27, 2000

Related U.S. Application Data

(62) Division of application No. 09/371,436, filed on Aug. 10, 1999, now Pat. No. 6,221,740.

(51) Int. Cl.[7] ............................................. B32B 35/00
(52) U.S. Cl. ...................... 156/584; 156/344; 156/581; 156/583.3; 29/239; 438/458
(58) Field of Search ................................. 156/344, 584, 156/580, 581, 583.1, 583.3; 438/458; 225/93, 105; 29/239

(56) References Cited

U.S. PATENT DOCUMENTS

| | | | |
|---|---|---|---|
| 2,614,055 A | 10/1952 | Senarelens | |
| 3,117,022 A | 1/1964 | Bronson et al. | |
| 3,225,820 A | 12/1965 | Rlordan | |

(List continued on next page.)

FOREIGN PATENT DOCUMENTS

| | | |
|---|---|---|
| EP | 112 230 A1 | 4/1987 |
| EP | 2 211 991 A | 7/1989 |
| EP | 355 913 A1 | 2/1990 |
| EP | 379 828 A2 | 8/1990 |
| EP | 459 177 A2 | 12/1991 |
| EP | 504 714 A2 | 9/1992 |
| EP | 861 917 A2 | 9/1998 |
| EP | 867 921 A2 | 9/1998 |
| EP | 886 300 A2 | 12/1998 |
| JP | 59-054217 A | 3/1984 |
| WO | WO 95/10718 A1 | 4/1995 |
| WO | WO 95/20824 A1 | 8/1995 |
| WO | WO 95/31825 A1 | 11/1995 |

OTHER PUBLICATIONS

Alles et al., "Thin Film Silicon on Insulator: An Enabling Technology," *Semiconductor International*, pp. 67–72 (1997).

Burggraff, P., "Advanced Plasma Source: Waht's Working?" *Semiconductor International*, pp. 56–59 (May 1994).

Basta, N., "Ion–Beaming Implantation," *High Technology*, (1985).

Cassidy, Victor M., "Ion Implantation Process Toughens Metalworking Tools," *Modern Motals*, pp. 65–67 (1984).

Cheung, N.W., "Plasma Immersion Ion Implantation for Semiconductor Processing," *Material Chemistry and Physics*, 46(2–3): 132–139 (1996).

(List continued on next page.)

*Primary Examiner*—Mark A. Osele
(74) *Attorney, Agent, or Firm*—Townsend and Townsend and Crew LLP

(57) ABSTRACT

A cleaving tool provides pressurized gas to the edge of a substrate to cleave the substrate at a selected interface. A substrate, such as a bonded substrate, is loaded into the cleaving tool, and two halves of the tool are brought together to apply a selected pressure to the substrate. A compliant pad of selected elastic resistance provides support to the substrate while allowing the substrate to expand during the cleaving process. Bringing the two halves of the tool together also compresses an edge seal against the perimeter of the substrate. A thin tube connected to a high-pressure gas source extends through the edge seal and provides a burst of gas to separate the substrate into at least two sheets. In a further embodiment, the perimeter of the substrate is struck with an edge prior to applying the gas pressure.

5 Claims, 8 Drawing Sheets

U.S. PATENT DOCUMENTS

| | | |
|---|---|---|
| 3,551,213 A | 12/1970 | Boyle |
| 3,770,499 A | 11/1973 | Crowe et al. |
| 3,786,358 A | 1/1974 | King |
| 3,806,380 A | 4/1974 | Kitada et al. |
| 3,832,219 A | 8/1974 | Nelson et al. |
| 3,900,636 A | 8/1975 | Curry et al. |
| 3,901,423 A | 8/1975 | Hillberry et al. |
| 3,915,757 A | 10/1975 | Engel |
| 3,957,107 A | 5/1976 | Alotz et al. |
| 3,993,909 A | 11/1976 | Drews et al. |
| 4,006,340 A | 2/1977 | Gomais |
| 4,039,416 A | 8/1977 | White |
| 4,074,139 A | 2/1978 | Pankova |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,170,662 A | 10/1979 | Weiss et al. |
| 4,244,348 A | 1/1981 | Wilkes |
| 4,252,837 A | 2/1981 | Auton |
| 4,274,004 A | 6/1981 | Kanai |
| 4,342,631 A | 8/1982 | White et al. |
| 4,346,123 A | 8/1982 | Kaufman |
| 4,361,600 A | 11/1982 | Brown et al. |
| 4,368,083 A | 1/1983 | Bruel et al. |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Sperl |
| 4,500,563 A | 2/1985 | Ellenberger et al. |
| 4,508,056 A | 4/1985 | Bruel et al. |
| 4,536,637 A | 8/1985 | Bruel |
| 4,539,050 A | 9/1985 | Kramler et al. |
| 4,566,403 A | 1/1986 | Foumier |
| 4,567,505 A | 1/1986 | Pease et al. |
| 4,568,583 A | 2/1986 | Jackson et al. |
| 4,585,945 A | 4/1986 | Bruel et al. |
| 4,684,535 A | 8/1987 | Heinecke et al. |
| 4,704,302 A | 11/1987 | Bruel et al. |
| 4,717,683 A | 1/1988 | Parillo et al. |
| 4,727,047 A | 2/1988 | Bozler et al. |
| 4,764,394 A | 8/1988 | Conrad |
| 4,837,172 A | 6/1989 | Mizuno et al. |
| 4,846,928 A | 7/1989 | Dolins et al. |
| 4,847,782 A | 7/1989 | Barna et al. |
| 4,853,250 A | 8/1989 | Boulos et al. |
| 4,883,561 A | 11/1989 | Gmitter et al. |
| 4,887,005 A | 12/1989 | Rough et al. |
| 4,894,709 A | 1/1990 | Phillips et al. |
| 4,931,405 A | 6/1990 | Kamijo et al. |
| 4,948,458 A | 8/1990 | Ogle |
| 4,952,273 A | 8/1990 | Popov |
| 4,960,073 A | 10/1990 | Suzuki et al. |
| 4,982,090 A | 1/1991 | Wittmaack |
| 4,996,077 A | 2/1991 | Moslehi |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,110,748 A | 5/1992 | Sarma |
| 5,133,826 A | 7/1992 | Dandl |
| 5,196,355 A | 3/1993 | Wittkower |
| 5,198,371 A | 3/1993 | Li |
| 5,202,095 A | 4/1993 | Houchlin et al. |
| 5,203,960 A | 4/1993 | Dandl |
| 5,213,451 A | 5/1993 | Frank |
| 5,234,529 A | 8/1993 | Johnson |
| 5,234,585 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,269,880 A | 12/1993 | Jolly et al. |
| 5,273,610 A | 12/1993 | Thomas, III et al. |
| 5,304,509 A | 4/1994 | Sopori |
| 5,342,472 A | 8/1994 | Imahashi et al. |
| 5,354,381 A | 10/1994 | Shang |
| 5,363,603 A | 11/1994 | Miller et al. |
| 5,366,710 A | 11/1994 | Chen et al. |
| 5,370,785 A | 12/1994 | Dandl |
| 5,374,564 A | 12/1994 | Bruel |
| 5,376,560 A | 12/1994 | Aronowitz et al. |
| 5,404,079 A | 4/1995 | Ohkuni et al. |
| 5,405,480 A | 4/1995 | Benzing et al. |
| 5,411,592 A | 5/1995 | Ovshinsky et al. |
| 5,435,880 A | 7/1995 | Minato et al. |
| 5,487,785 A | 1/1996 | Horiike |
| 5,494,835 A | 2/1996 | Bruel |
| 5,504,328 A | 4/1996 | Bonser |
| 5,558,718 A | 9/1996 | Leung |
| 5,559,043 A | 9/1996 | Bruel |
| 5,585,304 A | 12/1996 | Hayashi et al. |
| 5,611,855 A | 3/1997 | Wjaranakula |
| 5,643,834 A | 7/1997 | Harada et al. |
| 5,653,811 A | 8/1997 | Chan |
| 5,705,421 A | 1/1998 | Matsushita et al. |
| 5,710,057 A | 1/1998 | Kenny |
| 5,714,395 A | 2/1998 | Bruel |
| 5,755,914 A | 5/1998 | Yonehara |
| 5,804,086 A | 9/1998 | Bruel |
| 5,854,123 A | 12/1998 | Sato et al. |
| 5,869,387 A | 2/1999 | Sato et al. |
| 5,877,070 A | 3/1999 | Goesele et al. |
| 5,882,987 A | 3/1999 | Srikrishnan |
| 5,920,764 A | 7/1999 | Hanson et al. |
| 5,953,622 A | 9/1999 | Lee et al. |
| 5,966,620 A | 10/1999 | Sakeguchi et al. |

OTHER PUBLICATIONS

Choyke et al., "Mechanical Response of Single Crystal Si to Very High Fluence H+ Implantation," *Nuc. Instr. Meth.*, 209–210:407–412 (1983).

Choyke et al., " Implanted Hydrogen effect of High Concentrations in Model Low Z Shielding Materials," *J. Nuc. Mtrls.*, 122–23:1585–86 (1984).

Choyke et al., "A Comparative Study of Near–Surface Effects Due to Very High Fluence H+ Implantation in Single Crystal FZ, CZ, and Web SI," *Mat. Res. Soc. Symp. Proc.*, 27:359–364 (1984).

Chu et al. "Plasma Immersion Ion Implantation—A Fledgling Technique for Semiconductor Processing," *Materials Science and Engineering Reports: A Review Journal*, R17(6–7): 207/280 (1996) cover page and table of contents only.

Chu et al., "Recent Applications of Plasma Immersion Ion Implantation," *Semicondcutor International*, pp. 165–172 (1996).

Chu, Paul K., "Synthesis of SOI Materials Using Plasma Immersion Ion Implantation," *1997 Mat. Res. Soc. Symp. Proc.*, 438:333–343 (1997).

Corbett et al., "Embrittlement of Materials: Si(H) as a Model System," *J. Nuc. Mtrls.*, 169: 179–184 (1989).

Hulett, D.M. et al., "Ion Nitriding and Ion Implantation: A Comparison," *Metal Progress*, pp. 18–21 (1985).

I.B.M. Technical Disclosure Bulletin, vol., 29: No. 3, p. 1416 (Aug. 1986).

Johnson et al., "Hydrogen–Induced Platelets in Silicon: Separation of Nucleation and Growth," *Mtrls. Sci. Forum*, 83–87:33–38 (1992).

Lee et al., "A Novel Pattern Transfer Process for Bonded SOI Giga–bit DRAMS," *1996 IEEE Int'l. SOI Conference Proceedings, IEEE Electron Devices Society*, (1996.).

Li, J., "Novel Semiconductor Substrate Formed by Hydrogen Ion Implantation into Silicon," *Appl. Phys. Lett.*, 55(21):2223–2224 (1989).

Lu et al., "SOI Material Technology Using Plasma Immersion Ion Implantation," *Proceedings 1996 IEEE International SOI Conference* (Oct. 1996).

Matsuda et al., "Large Diameter Ion Beam Implantation System," *Nuclear Instruments and Methods*, B21:314–316 (1987).

Milnes et al., "Peeled Film Technology for solar Cells," pp. 338–341.

Moreau, Wayne M., *Semiconductor Lithography, Principles, Practices, and Materials*, Plenum Press (1988).

Oshima et al., "Defects in Si irradiated with D–T neutrons, D and He ions," *J. Nuc. Mtrls.*, 179–181:947–950 (1991).

*Patent Abstracts of Japan*, vol. 7, No. 107(E–174), (May 11, 1993) JP–58–030145 (Feb. 22, 1983).

Picraux et al., "Ion Implantation of Surfaces," *Scientific American*, 252(3):102–113 (1985).

Reiner et al., "A New Low–Energy Ion Implanter for Bombardment of Cylindrical Surfaces," *Vacuum*, 35(12):577–578 (1985).

Sioshansi, Piran, "Ion Beam Modification of Materials for Industry," *Thin Solid Film*, 118:61–71 (1984).

Wolf, Stanley Ph.D., *Silicon Processing for the VLSI Era vol. 2*, pp. 66–79, Lattice Press (1990).

U.S. Dept. of Energy, "The Fusion Connection: . . . ", *Plasma Coating*, pp. 6–7 (1985).

Veldkamp et al., Binary Optics, *Scientific American*, pp. 50–55 (May 1992).

SUBSTRATE CLEAVING TOOL AND METHOD

RELATED APPLICATIONS

This patent application is a division of U.S. application Ser. No. 09/371,436 filed Aug. 10, 1999, now U.S. Pat. No. 6,221,740.

BACKGROUND OF THE INVENTION

The present invention relates to substrates, such as may be used for integrated circuit fabrication, micro-machining applications, and similar substrates, and more particularly to cleaving hybrid or composite substrates.

Semiconductor device fabrication technology continues to advance in the pursuit of smaller, faster devices. Integrated circuits devices become more complex, and in many cases, bigger. New materials and methods are being developed to meet these and other performance requirements. For example, many integrated circuits are fabricated on a silicon "wafer", which was sawn out of a generally round ingot, or boule, and polished on at least one side. Not long ago, silicon wafers typically had a diameter of about 2–4 inches. Then, six inch, and now eight-inch, wafers became commonplace, and the industry is moving toward silicon wafers with a diameter of twelve inches for some applications. The larger diameter wafers can yield more chips per wafer, and improve throughput. Not surprisingly, the larger wafers are generally much more expensive than the smaller wafers.

Many integrated circuit devices are fabricated within a very narrow planar region close to the surface of the wafer. The remainder of the wafer provides mechanical support and may provide other functions, such as impurity gettering or a backside electrical contact. Thus, the semiconductor material may only need to be of device (i.e. high) quality for a thin region near the surface of the wafer. Epitaxial growth processes have been developed to address this issue. Generally, a thin film of high-purity or other high-quality film of semiconductor material is grown on a substrate, which can be the same material, or a different material, than the grown film. Unfortunately, epitaxial growth processes have not been easy to scale for use with the increased wafer diameters, and yields and throughput have suffered.

Wafer bonding is another process that uses a relatively thin film of semiconductor material. In some instances, a thin film of silicon, for example, is bonded to an insulating substrate, such as silicon oxide, to form a semiconductor-on-insulator ("SOI") structure. Many techniques have been developed to bond one wafer to another, using adhesives, surface activation, chemical activation, and the like. Some times a bulk wafer of silicon is bonded to an insulating substrate and then the silicon is lapped to the desired thickness, and other times a thin film of silicon is transferred to the insulating wafer.

Other wafer bonding methods have been developed for purposes other than to fabricate SOI substrates, such as transferring a thin film of high-quality semiconductor material onto a semiconductor or other substrate. Alternatively, it may be desirable to produce a thin film of material to form a layer in a micro-electrical-mechanical system ("MEMS") device. Accordingly, a technique and a device for cleaving substrates is desirable for producing a thin film of material to be transferred and/or for separating bonded wafers from each other, and for other purposes.

SUMMARY OF THE INVENTION

The present invention provides a method and apparatus for cleaving substrates, including composite substrates.

In one embodiment, a composite substrate of two wafers bonded together has a perimeter notch resulting from an edge-finishing process, typically performed by the wafer manufacturer, of one or both wafers. A seal is formed around at least a portion of the perimeter notch to define a plenum. A burst of gas is provided to the plenum to pressurize the plenum and cleave the substrate at a selected plane. In a further embodiment, the wafers are held together prior to separation with a selected pressure to facilitate cleaving the wafers while reducing breakage. In a still further embodiment, the pressure applied to the substrate during the cleave process varies across the substrate in a selected fashion.

These and other embodiments of the present invention, as well as some of its advantages and features are described in more detail in conjunction with the text below and attached figures.

DESCRIPTION OF THE PREFERRED EMBODIMENT

The present invention relates to a cleaving apparatus, method, and tools. Several situations may arise where it is desirable to cleave a substrate, such as to separate a thin film of material from a donor wafer, or to separate two bonded substrates.

A thin film separation method, known as a controlled-cleave process ("CCP"), is described in U.S. application Ser. No. 09/026,034 by Henley and Cheung, filed Feb. 19, 1998, and which is incorporated herein for all purposes. In the CCP process, ions and/or other particles are implanted into a wafer to form a cleave layer within the donor substrate. Energy is then applied to the donor substrate to initiate and propagate a cleave front or fronts that separates a thin film of material from the donor substrate. Typically, a target, or handle, wafer is bonded to the donor wafer between the ion implantation step and the cleave step to form a composite wafer. The thin film remains attached to the handle wafer after cleaving, and may be further processed to enhance the bonding between the thin film and the handle wafer.

Figure 1A:
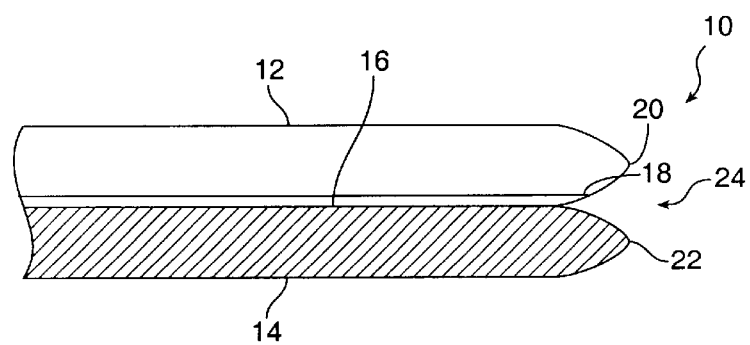
FIG. 1A is a simplified cross section of a composite substrate with two edge-finished wafers bonded together.

FIG. 1A is a simplified cross section of a portion of a composite substrate 10 formed from a first wafer 12 bonded to a second wafer 14 at an interface 16. The first wafer has a weakened and/or stressed layer 18, which may have been formed by implanting protons or other particles (e.g. hydrogen, deuterium, any combination of these) at a selected depth and concentration, using a plasma immersion ion implantation or beam line implantation or diffusion process, for example. The first wafer 12, as supplied from the manufacturer, has a finished edge 20 in the approximate shape of a truncated cone with rounded corners. The second wafer 14, as supplied from the manufacturer, also has a finished edge 22, but in the approximate shape of a bullet nose. The shapes of the wafer edges are given as examples only, and illustrate that a perimeter groove 24 forms between wafers with finished edges. The perimeter groove typically extends essentially around the substrate (except, e.g., in the region of a wafer alignment "flat"), the depth of the groove typically being greater than the wafer alignment error that occurs during bonding. Also, the design of the O-ring allows for mis-alignment.

Figure 1B:
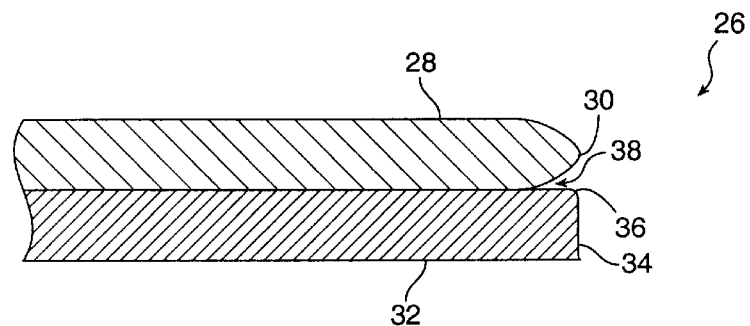
FIG. 1B is a simplified cross section of a composite substrate with one edge-finished wafer and one flush-edged wafer bonded together.

FIG. 1B is a simplified cross section of a portion of a composite substrate 26 formed from a first wafer 28 having a finished edge 30 and a second wafer 32 having a flush edge 34. The edge of the second wafer has not been shaped in a separate edge-finishing process; however, an artifact of a polishing process has left the corner 36 slightly rounded. The mating surfaces of the wafers that are bonded together to form a composite substrate are often polished to provide intimate surface contact in the bonding process. A perimeter groove 38 also forms between a wafer with a finished edge bonded to a wafer with a flush edge.

Figure 1C:
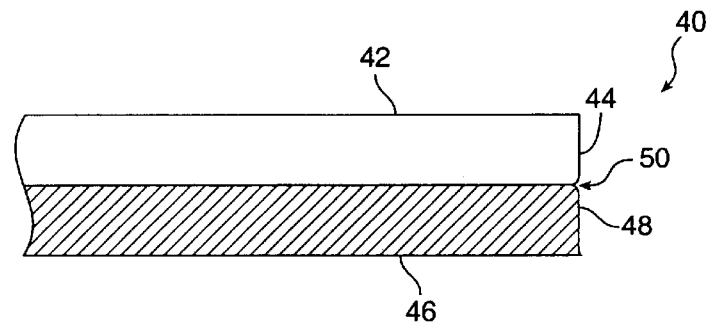
FIG. 1C is a simplified cross section of a composite substrate with two flush-edged wafers bonded together.

FIG. 1C is a simplified cross section of a portion of a composite substrate 40 formed from a first wafer 42 having a flush edge 44 and a second wafer 46, also having a flush edge 48. A relatively small notch 50 forms between the wafers as a result of the corner-rounding that occurred during the polishing process; however, this notch may not extend around the perimeter of the composite substrate, depending on the alignment of the wafers to each other.

Figure 2A:
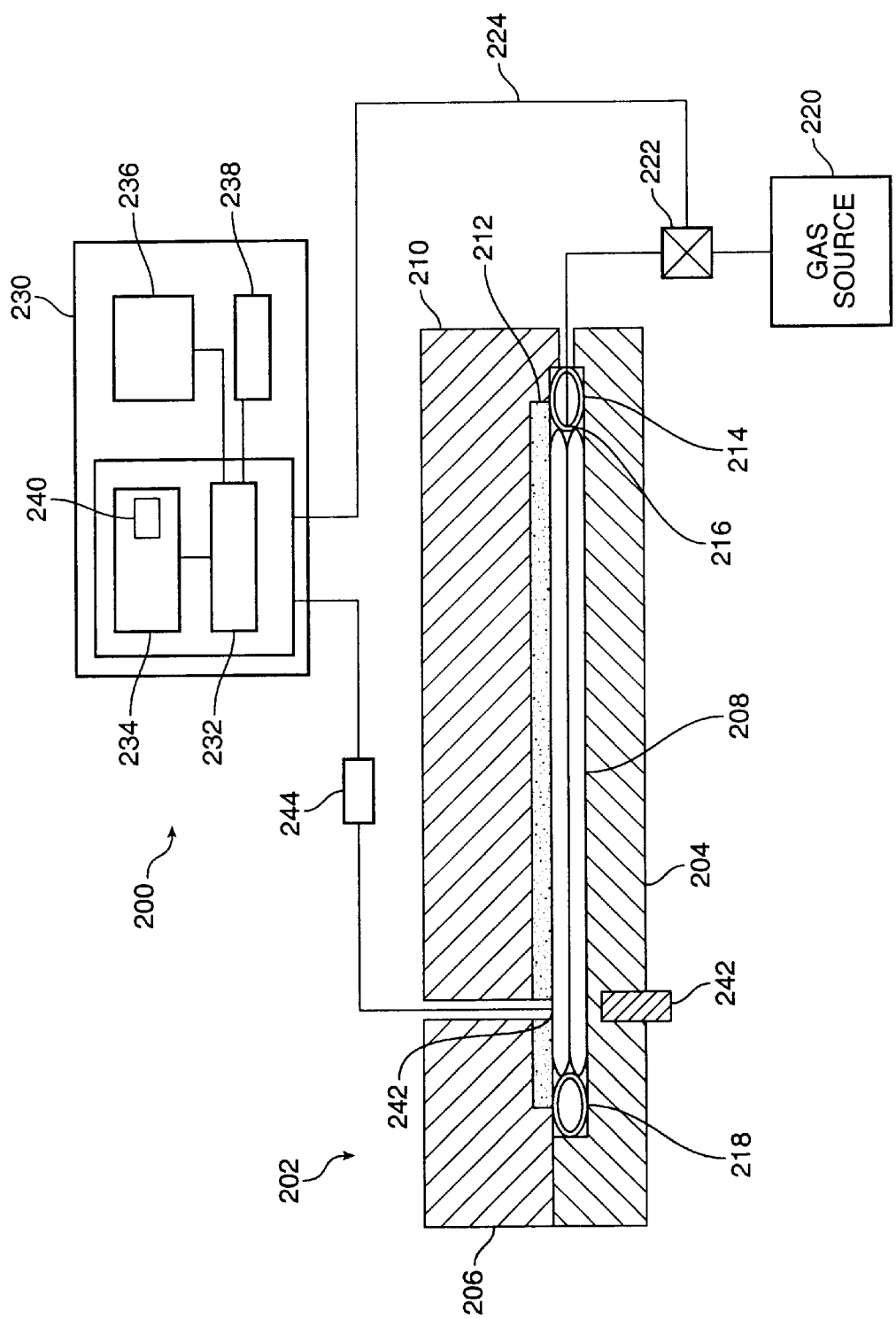
FIG. 2A is a simplified illustration of a wafer cleaving system.

FIG. 2A is a simplified representation of an apparatus 200 for separating thin films of material from composite substrates. A cleave tool 202 has a base shell 204 and a top shell 206 that can be separated (e.g. by lifting off or by a hinge mechanism) in order to load a composite substrate 208. The base shell is fabricated from a "hard" material, such as tooling plate (cast Al—Zn alloy) or other metal. The top shell has a hard, rigid cap 210 and also a compliant pad 212. The cap is fabricated from tooling plate, while the compliant pad is a latex sheet approximately ⅛ inch thick with 30 durometer, but could be made of another compliant material, such as silicone, urethane, neoprene, or other rubber, or other compliant material. The compliant pad supports the upper surface of the composite substrate during the cleave process while allowing the composite substrate to expand slightly to separate the composite substrate and transfer a thin film from the donor substrate to the handle substrate.

An O-ring 214 forms a seal around the perimeter edges of the composite substrate. The O-ring is hollow and operates at ambient (atmospheric) pressure to provide a compliance of 30 durometer, but could be sealed and pressurized to control the compliance and sealing force, or could be solid. A gas port 216, in this case formed by a needle extending through the O-ring, provides a burst, bursts, or stream of gas to a perimeter plenum formed by the sealed edge groove of the composite substrate. The O-ring 214 does not have to seal the entire perimeter of the composite substrate, such as if the composite substrate has an alignment flat 218, as will be discussed below.

Gas is provided from a gas source 220, such as a dry nitrogen source, but could be other types of gases, such as air, argon, or helium. The gas flow is controlled by a solenoid valve 222, or similar valve, which controls the gas supplied to the gas port 216. In a preferred embodiment, the gas source provides gas at a nominal pressure of about 300 psi., and the valve is controlled by a control line 224 to open for 22 msec. to provide a burst of gas to the gas port 216. The dynamics of the gas burst are generally sufficient to initiate and propagate cleaving of the composite substrate. Gas may be lost through leakage between the O-ring and the substrate, especially where the O-ring does not form a seal with the substrate, but such incidental loss appears to not be critical in cleaving the substrate. Multiple pulses of gas may be applied to facilitate cleaving, if necessary. Alternatively, the fluid may be replaced by a liquid or a combination of liquid and gas.

The control line can be a simple switch, or can be controlled by a controller 230, such as a computer. The controller includes a processor 232 coupled to a computer-readable memory 234, as well as a display 236, and a user input 238, such as a keyboard. The memory 234 can include read-only memory, random-addressable memory, and/or magnetic or optical media such as a floppy disk, a hard disk, or a compact disk. The memory stores a program 240 that configures the substrate cleave system to operate in a selected manner. It is understood that other controllers may be configured differently and have other appropriate block diagrams, or that the cleave system may be operated manually.

A detector 242 may be included to determine whether the cleave process has been completed. An indicator 244 receives a signal from the detector to indicate a change of condition of the composite substrate. The detector 242 can be an infrared source/sensor for example. When a cleave front propagates underneath the detector, the transmitted infrared light changes due to the separation of the wafer, resulting in an optical wedge that causes destructive interference of light at a specific spacing created in the wafer. In an alternative embodiment, an infrared source in the base could illuminate a sensor in the cap. The transmissive path would be altered by the cleave front. Alternatively, the detector could be an ultrasonic transducer, or a heater/temperature sensor. A heater could provide a pulse of heat to the composite substrate, and the thermal decay could indicate whether the composite substrate is intact, providing greater heatsinking and more rapid thermal decay, or whether the substrate has been cleaved. The indicator 242 can be coupled to the controller 230, or can provide a sensory signal for manual operation. Although the cleave indicator is shown in conjunction with a gas pressure cleave tool, a cleave indicator would be beneficial with other types of cleave tools, such as thermal or mechanical cleave tools.

Figure 2B:
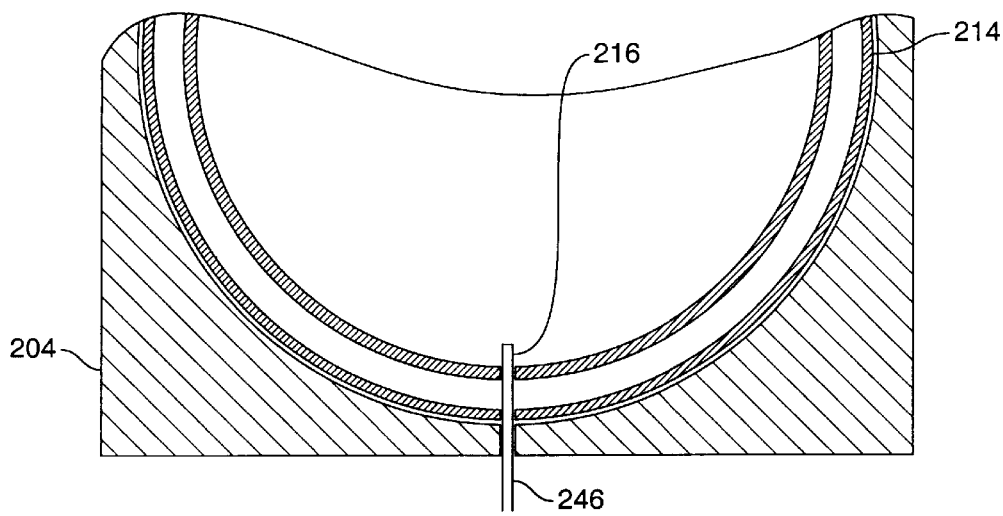
FIG. 2B is a simplified top view of a portion of the wafer cleaving system shown in FIG. 2A, further illustrating details of a gas port and an edge seal.

FIG. 2B is a simplified top view representing the base 204 and the O-ring 214, which is shown as sectioned. The gas port 216 is the outlet of needle-like tubing 246, such as is used to make hypodermic needles. In a preferred embodiment, the tubing is made of type 316 stainless steel with an internal diameter of about 0.010 mm and 0.5 mm outside diameter. The tubing can be a product made by EFD Brand Part Number 5125CH-B. The gas port 216 is located about 10 mils out from the O-ring, i.e., the tubing protrudes out of the O-ring about 10 mils. A pin may be used to form the hole in the O-ring to push the tubing through.

Figure 2C:
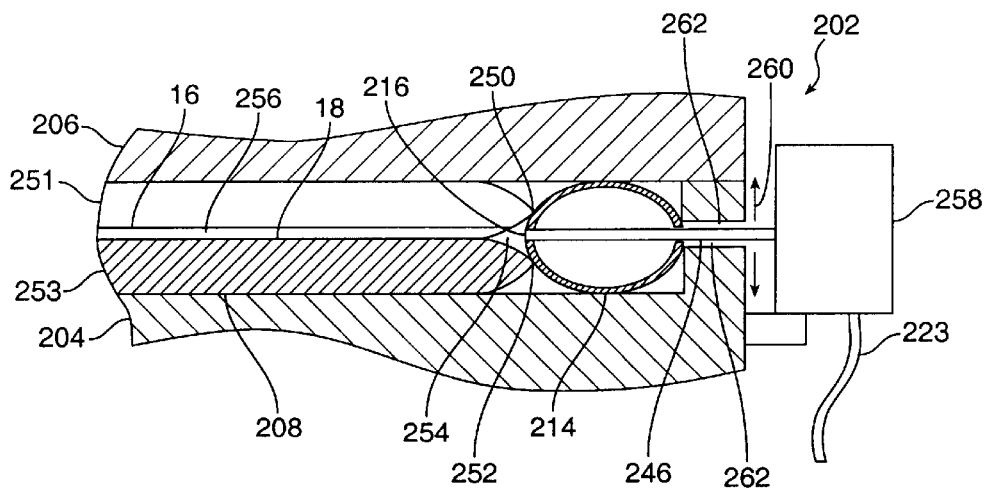
FIG. 2C is a simplified cross section of a portion of a substrate cleaving apparatus with a substrate disposed in a tool.

FIG. 2C is a simplified cross view of a portion of the cleave tool 202 showing further details of the O-ring 214, composite substrate 208 and the gas port 216. The inside diameter of the O-ring is slightly larger than the diameter of the composite substrate, allowing the composite to be easily placed onto the base 204 of the cleave tool 202. When the top 206 is assembled to the base 204 of the cleave tool 202, the O-ring 214 is compressed into an oblong shape, moving the gas port 216 toward the center of the substrate and contacting the first edge 250 and the second edge 252 of the composite substrate 208 to seal the edge groove and form a plenum 254. The gas port 216 is situated within the plenum 254 to pressurize the plenum, thus creating forces to separate the first substrate 251 from the second substrate 253. If the weakened layer 18 is weaker than the bonding interface 16, the composite substrate cleaves at the weakened layer and transfers a thin film 256 of the first substrate 251 to the second substrate 253.

A height adjustment mechanism 258 is provided to accurately align the gas port 216 with the edge groove/plenum. The height adjustment mechanism moves, along with the tubing and gas port, relative to the top/base of the cleave tool, as represented by the arrows 260. Alignment accuracy within 0.2 mm or less is preferred, and is achieved with a manually adjusted lead screw. Other height adjustment methods may be used, such as a voice coil or stepper motor, and the height adjustment may be controlled by the controller (see FIG. 2A.). The gas line 223 to the height adjustment mechanism 258 is flexible to allow for the height adjustment. Similarly, the via 262 through the base 204 is larger than the tubing diameter, and may be an over-sized hole or a slot.

Figure 2D:
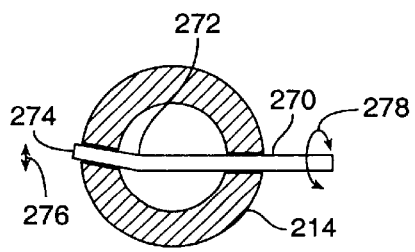
FIG. 2D is a simplified cross section of an O-ring with a bent gas delivery tube.

FIG. 2D is a simplified cross section showing a further refinement of the tubing and gas port or fluid port. The tubing 270 has a slight bend 272, of between about 5–15 degrees that is about 3 mm back from the gas port 274, so that the bend occurs within the interior of the O-ring 214. This allows vertical adjustment of the gas port 274, represented by the arrows 276, by rotating the tubing 270, represented by the arrows 278. Rotational adjustment is used by itself or in conjunction with the height adjustment mechanism (see FIG. 2C) for fine, continuous placement of the gas port. Rotating the tubing also allows an operator to confirm that the gas port is within the edge groove by providing tactile feedback as the gas port contacts one edge upon rotation in one direction, and then the other edge as rotation is reversed, if not used in an automated system.

Figure 2E:
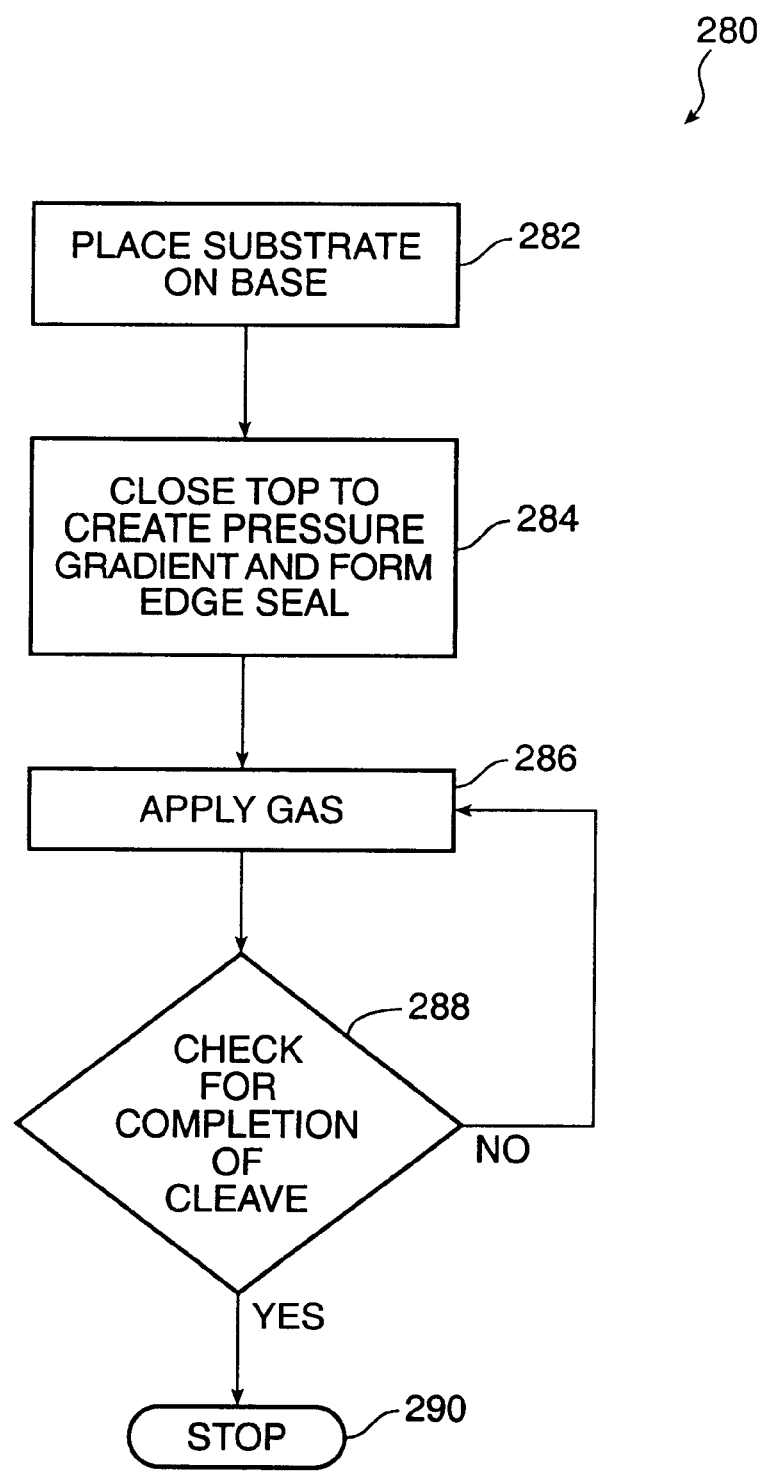
FIG. 2E is a simplified flow chart of a process according to the present invention.

FIG. 2E is a simplified flow chart representing a process 280 according to the present invention. After placing a substrate on the base (step 282), the top is closed (step 284), which compresses the compliant pad against the substrate. As will be discussed in further detail below in relation to FIG. 5, the top is closed in a fashion to apply a greater force against the substrate in the regions further from the gas port. In a preferred embodiment of a substrate cleaving tool, closing the top also compresses the perimeter O-ring to form a seal with at least a portion of the perimeter of the substrate.

Next, a burst of gas is applied TO a region on the perimeter of the substrate (step 286). If the substrate cleaving tool has a cleave indicator, the substrate is then checked for completion of the cleave (step 288). If the cleave is complete, the process can stop (step 290). If the cleave is not complete, another burst of gas may be applied. The subsequent burst of gas may be of the same duration and pressure, or of a different duration and/or pressure than the initial burst of gas. It is noted that some substrates are easier to cleave than others, depending on the type of material and pre-cleave treatment (e.g. implant species, dosage, and energy), and that some cleave processes may be consistent and reliable enough to be performed without a cleave indicator.

Figure 2F:
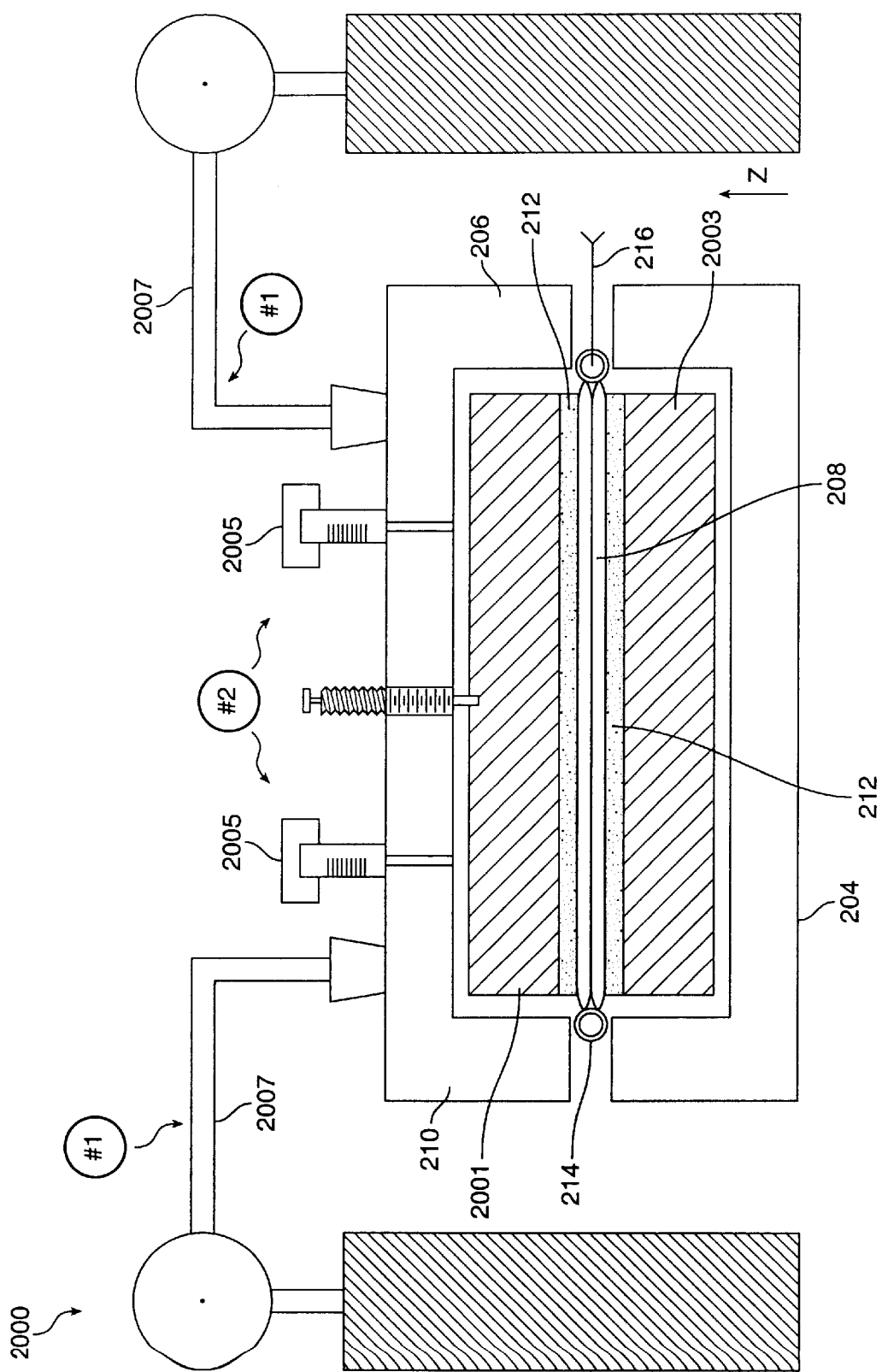
FIG. 2F is a simplified diagram of a wafer cleaving system according to an alternative embodiment of the present invention.

FIG. 2F is a simplified diagram of a wafer cleaving system 2000 according to an alternative embodiment of the present invention. This diagram is merely an example, which should not limit the scope of the claims herein. One of ordinary skill in the art would recognize many other variations, alternatives, and, modifications. Like reference numerals are used in this Fig. as the previous Figs. for easy referencing, but are not intended to be unduly limiting. Here, the cleaving system 2000 includes a variety of features such as base shell 204 and top shell 206 that can be separated from each other in order to load a composite substrate 208, e.g., wafers. The base shell is fabricated from a hard and non-compliant material such as tooling plate, plastic, or other metals or combination of metals and plastics. The top shell has a hard, rigid cap 210, which houses an adjustable plate 2001. The adjustable plate is made of a flat material, which interfaces between adjustable members 2005 and compliant pad 212. Each of the adjustable members can adjust the vertical or z-position of the adjustable plate. In a specific embodiment, there are more than one or preferably three or more members, which are spatially placed equal distance from each other on the top shell. Each of the adjustable members is adjusted in a manner to enhance the cleaving action of the composite substrate. The system also can have a plate 2003 and compliant pad 212 on the base shell. Here, the plate on the base shell can be adjustable or fixed depending upon the application. The compliant pads support the faces of the substrate during a cleaving process while allowing such substrate to expand slightly to separate the substrate. The substrate separates a portion of the donor substrate material from the donor substrate.

An O-ring 214 forms a seal around the perimeter edges of the composite substrate. The O-ring is hollow and operates at ambient (atmospheric) pressure to provide a compliance of 30 durometer, but could be sealed and pressurized to control the compliance and sealing force or could be solid. The system also has a fluid port 216, which provides compressed fluid into the chamber to initiate and maintain a controlled cleavage process.

The system also has clamping means 2007, which presses the base shell against the top shell. The O-ring is compressed between each of the shells to seal the outer periphery of the substrate against the O-ring. In a specific embodiment, the clamping means is a "Destaco" clamp or three of these clamps, which hold the base shell to the top shell. In a specific embodiment, the combination of the adjustable members and the clamping means are adjusted to produce a desired pressure gradient on each of the faces of the substrate. The pressure gradient is adjusted by the adjustable members to produce a desired cleaving action. In a specific embodiment, the applied pressure on the substrate faces is greater near the fluid injection point and decreases further away from the fluid injection point. This gradient may improve a cleaving action. Alternatively, the pressure across the faces of each substrate is constant and free from a gradient to improve cleaving action.

Figure 3A:
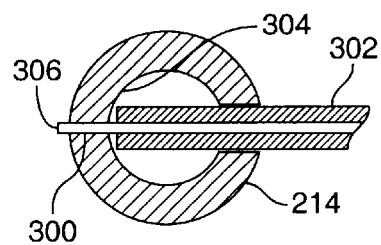
FIG. 3A is a simplified cross section of an O-ring and gas delivery tube with a tubing retainer.

FIG. 3A is a simplified cross section of fine tubing 300 supported by a tubing retainer 302. The tubing retainer is co-axial with the fine tubing, and is a section of drilled metal rod, for example, glued to the tubing, but could be other material, such as plastic. The tubing retainer 302 supports the fine tubing 300 to the interior surface 304 of the O-ring, thus increasing the stiffness of the tubing assembly and allowing for better height control of the gas port 306, as well as better durability, and the option of using finer and/or thinner-walled tubing.

Figure 3B:
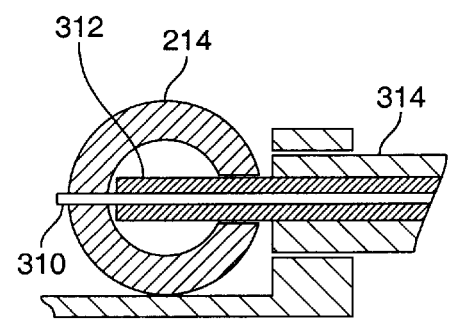
FIG. 3B is a simplified cross section of an O-ring with a tubing retainer collet.

FIG. 3B is a simplified cross section of fine tubing 310 supported by a tubing retainer 312, which is further supported by a retainer collet 314. The retainer collet provides additional stiffness to the tubing assembly, and allows sub-assemblies of fine tubing and tubing retainers to be manufactured in anticipation of rapid exchanging of gas ports for maintenance or to configure the cleave system for different substrates. In lieu of a retainer collet, a tubing retainer with a stepped diameter may be manufactured, either out of a single piece of rod, for example, or assembled from multiple pieces.

Although the above injector has been described in terms of tubing, it can also be may other means for supplying gas and/or fluid to the system. Here, the means can include, among others, almost any suitable member that directs fluid into the system. The member can be shaped in a variety of configurations such as a rectangle, a semicircle, or other shape, which is suitable for directing the fluid into the system. The end of the means can be flared, pointed, or any other shape suitable for supplying the fluid. One of ordinary skill in the art would recognize many other variations, alternatives, and modifications.

Figure 4:
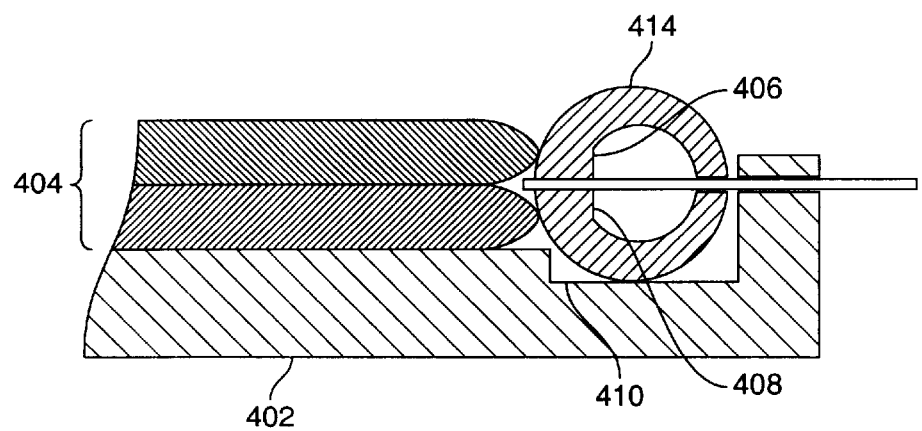
FIG. 4 is a simplified cross section of a portion of a wafer-cleaving tool having another embodiment of an O-ring and base shell.

FIG. 4 is a simplified cross section of a portion of a cleave tool showing alternative embodiments for the O-ring 414 and the bottom shell 402. The outer diameter of the O-ring is substantially greater than the thickness of the composite substrate. Additionally, the O-ring does not have a constant thickness, but rather has a thicker section 406 near the gas port. The thicker section of the O-ring where the O-ring will contact the substrate to form an edge seal improves the contact force and stiffens the side of the plenum formed by the O-ring. An O-ring groove 410 is provided in the bottom shell, and a similar groove may be provided in the top shell (not shown), or the top shell may be flat.

Figure 5:
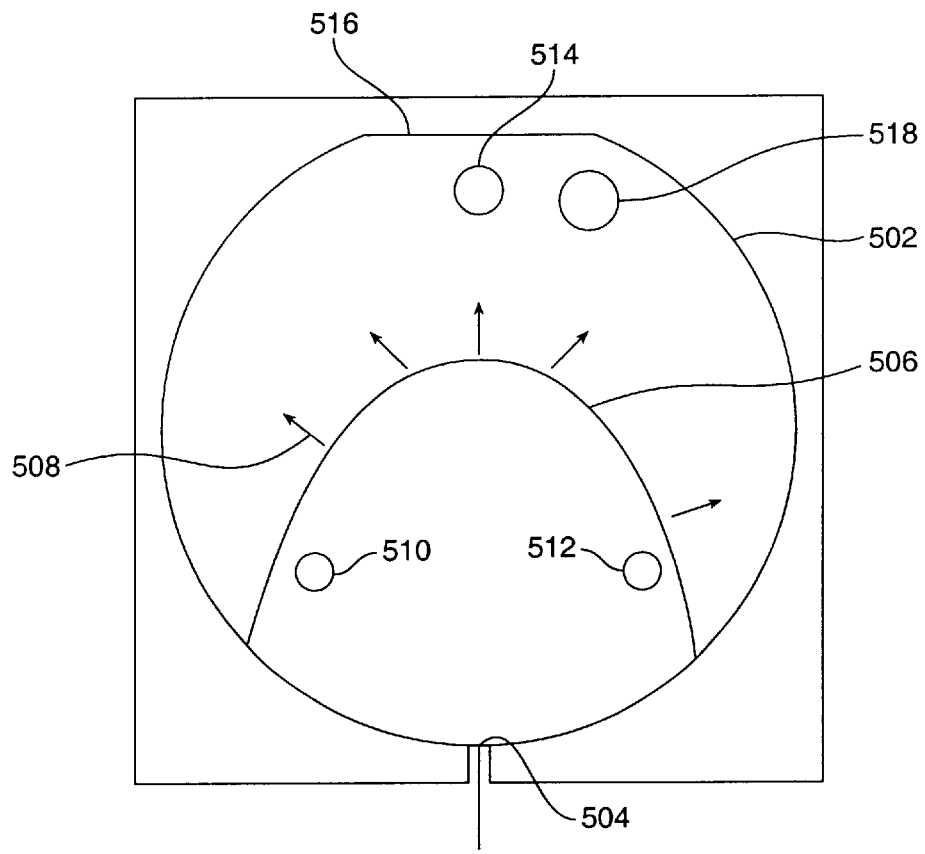
FIG. 5 is a simplified representation of the relationship of various elements of a cleave tool and a cleave front.

FIG. 5 is a simplified diagram representing how force is applied to the top shell (not shown in this figure) to hold it against the bottom shell (not shown in this figure) and thus provide pressure to the composite substrate during the cleave process. A circle 502 as it would lie under the top shell represents the outline of a substrate. The position of the gas port is represented by the contact of a line with the circle 504. A cleave front is represented by a curved line 506, propagating in the directions indicated by arrows 508. The shape of the cleave front is chosen solely for illustrative purposes, and does not necessarily represent the true shape of the cleave front, which depends on many factors, including the prior processing and type of composite substrate being cleaved. Force is applied at three locations, represented by the small circles 510, 512, 514. Force is generated by cam-over clamps mounted to the base shell support structure. The top shell is placed on the base shell, and the clamps are set to force the top shell against the base shell and to compress the O-ring. The force the clamps apply may be adjusted by turning the clamp screw to extend the length of the clamp pad from the frame, as is well known. The nominal force of all clamps is set to provide a pressure on the substrate of about 5 to 50 psia. Then, the clamp screws of the two clamps 510, 512 nearest the gas port 504 are extended an additional ¼ turn further than the clamp 514 furthest from the gas port.

This provides a differential pressure across the substrate. A differential pressure is desirable because of the nature of the cleave initiation and propagation. In most materials of interest, the cleave is essentially a stressed fracture. The energy required to initiate such a fracture may be lowered by providing a local mechanical defect, such as a crack or scratch. Thus, once the cleave is initiated in the low pressure region (near the gas port), higher pressure may be applied to the substrate to keep the cleaved halves from "jumping" and potentially breaking across the face of the half. A sensor, represented by a circle 518, is placed near the flat of the substrate to determine if the cleave has propagated through the substrate, as discussed above. Alternatively, a constant pressure may be applied, depending on the type of material (s) the substrate is made of, the thickness of the cleaved halves, and the pressure and duration of the gas being applied, and other factors.

A pressure gradient may be important to prevent some composite substrates from flying apart and breaking when cleaved, while allowing the cleave to form and propagate. It is believed the combination of the applied pressure gradient and the compliant pad in the top shell allow the efficient cleaving of composite substrates while avoiding breakage, especially of the donor substrate. It is recognized that other combinations of compliant pads and pressures may obtain similar results, and that different pressures and pressure gradients may be appropriate for different materials or cleave conditions. Similarly, the force may be applied between the top shell and the base shell by a variety of mechanisms, such as pre-set springs, weights, gas or hydraulic cylinders, or even a compliant pad with a graded durometer, the durometer being less near the gas port, where the cleave is initiated.

Figure 6A:
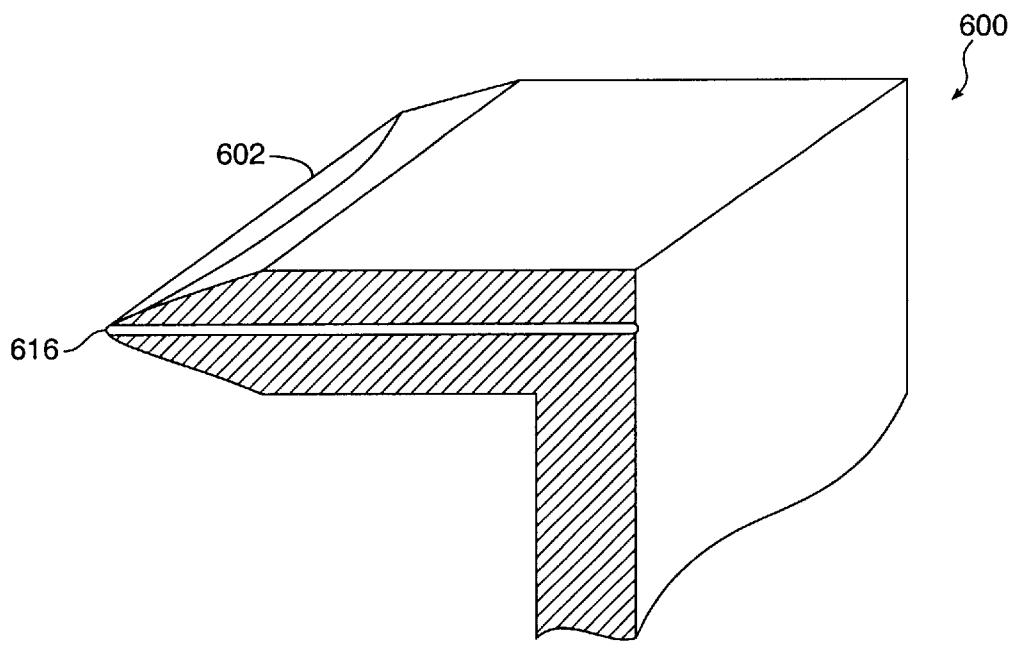
FIG. 6A is a simplified sectioned view of an edged tool with an integrated gas port.

FIG. 6A is a simplified sectioned view of a tool 600 that combines a mechanical cleaving action with a pressure cleaving action. The tool has an edge 602 suitable for contacting the edge of a composite wafer. The composite wafer may have a perimeter groove, as shown in FIGS. 1A and 1B, or may be composed of flush-edged wafers, as shown in FIG. 1C. The edge of the tool is lightly tapped against the edge of the composite substrate to help initiate a cleave. Gas is admitted to the cleave region via a gas port 616 incorporated into the tool edge to help initiate and/or propagate the cleave formed by the mechanical action of the edge of the tool. In another embodiment, thick walled tubing with a small I.D., or rod with a small center through hole, is sharpened to a chisel edge. Alternatively, the process may be performed in two steps using a razor blade, for example, tapped against the edge of a composite wafer before placing the composite wafer into a cleaving apparatus, as shown in FIG. 2A.

Figure 6B:
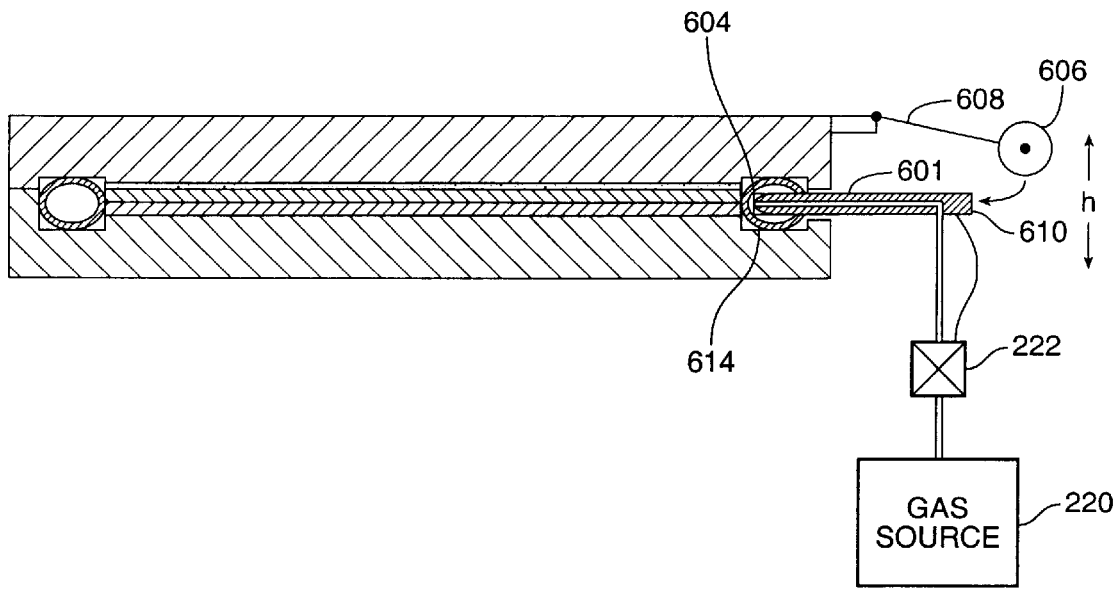
FIG. 6B is a simplified representation of a wafer cleaving system using mechanical force and gas pressure.

FIG. 6B is a simplified illustration of a substrate cleaving apparatus incorporating a tool similar to the tool shown in FIG. 6A. A composite substrate 40 formed from two substrates with flush edges, as shown in FIG. 1C, is placed in the cleaving tool. An edged tool 601 extends through the O-ring 614 to contact the edge 604 of the composite wafer.

The edged tool is tapped against the composite substrate by letting a weight 606 of a selected mass supported by an arm 608 of selected length fall a selected height, h, to contact the edge tool so that the edge of the tool taps the edge of the composite wafer with a selected force and momentum. Other mechanisms can be used to create the desired force, such as a spring-loaded trigger mechanism or a pneumatic cylinder. A force sensor 610, such as a strain gauge or electrical switch, detects when the weight strikes the edged tool and triggers a pre-set pulse of gas from the gas source 220, controlled by the valve 222, which is coupled to the pressure sensor. Additional control structure is not shown for purposes of clarity, as such structure is well known in the art.

Figure 6C:
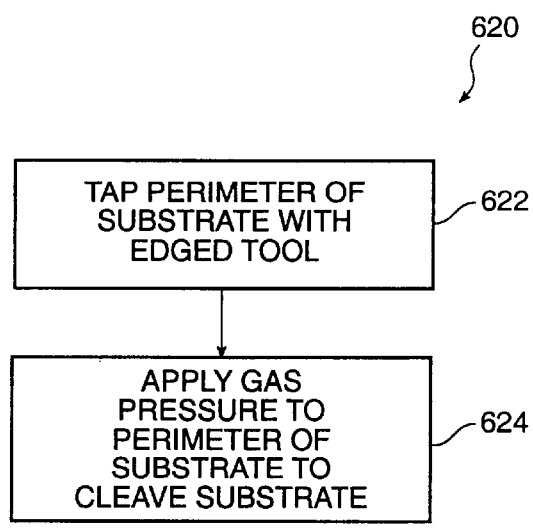
FIG. 6C is a simplified flow chart of a process according to another embodiment of the present invention.

FIG. 6C is a simplified flow chart of a cleave process 620 according to another embodiment of the present invention. A substrate is first tapped with an edged tool as shown in FIGS. 6A and 6B. It is believed that this can have many effects that promote cleaving, including providing a wedging force between the eventual cleaved halves of the substrate, initiating a scratch or crack to lower the energy required to initiate a cleave, and to form a small volume for the gas to enter and separate the substrate by gas pressure. After tapping the perimeter of the substrate with the edged tool, gas pressure is applied to the tapped region, as described above. The tapping and gas pressure may be performed essentially concurrently, sequentially in the same substrate cleaving tool, or at different locations and times.

While the above is a complete description of specific embodiments of the present invention, various modifications, variations, and alternatives may be employed. For example, although the substrates discussed have been generally round, substrates of other shapes, such as a rectangular shape, could be used. Specifically, a silicon-on-silicon wafer may be used instead of a silicon-on-insulator wafer, or a silicon carbide, gallium-arsenide, or silicon-germanium wafer may be surface finished. Additionally, the cleaved surface of the donor wafer could be prepared for another thin-film transfer by the above methods. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. An apparatus for cleaving a substrate, the apparatus comprising:
    a base configured to accept and support a substrate;
    a top movably coupled to the base, the substrate being disposed between the base and the top;
    a compliant pad proximate to the substrate such that when the top is coupled to the base, a selected amount of pressure is applied to the substrate through the compliant pad;
    an edge seal capable of forming a gas seal around a perimeter of the substrate when the top is coupled to the base to form a plenum; and
    a gas port coupled to the plenum and capable of providing gas to the plenum to pressurize the plenum and cleave the substrate.

2. The apparatus of claim 1 wherein the compliant pad comprises rubber with a durometer of about 30.

3. The apparatus of claim 1 wherein the pressure applied to the substrate is applied as a pressure gradient increasing from an initial pressure near the gas port.

4. The apparatus of claim 1 further comprising:
    a gas source capable of providing gas at a gas pressure of about 300 psig; and
    a valve disposed between the gas source and the gas port, the valve capable of modulating the flow of gas from the gas source to the gas port to create a burst of gas at the gas port.

5. An apparatus for cleaving a substrate, the apparatus comprising:
    a base configured to accept and support a substrate having an edge groove;
    a top movably coupled to the base, the substrate being disposed between the base and the top;
    a rubber pad incorporated into the top, the rubber pad applying a selected amount of pressure, as a pressure gradient, to the substrate when the base is coupled to the top;
    an O-ring essentially surrounding the substrate and forming a gas seal with at least a portion of a perimeter of the substrate to form a plenum between the edge groove and the O-ring;
    a tube extending through the O-ring, an end of the tube forming a gas port in the plenum, the tube being coupled to
    a valve capable of modulating gas at a pressure of at least about 300 psig from a gas supply through the tube into the plenum.

\* \* \* \* \*